Figure 1:
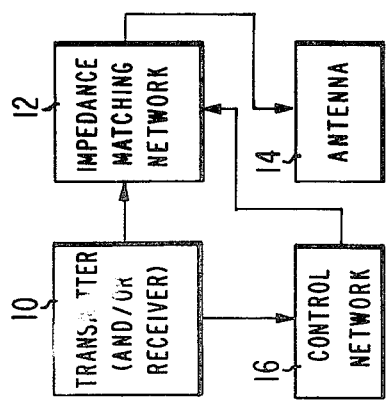

United States Patent [19]

Lysobey

[11] Patent Number: 4,486,723
[45] Date of Patent: Dec. 4, 1984

[54] DIODE SWITCHING SYSTEM FOR A SELECTABLE IMPEDANCE MATCHING NETWORK

[75] Inventor: Morris Lysobey, Cherry Hill, N.J.

[73] Assignee: RCA Corporation, New York, N.Y.

[21] Appl. No.: 456,033

[22] Filed: Jan. 6, 1983

[51] Int. Cl.³ .............................................. H03H 7/40
[52] U.S. Cl. .................................. 333/17 M; 333/32; 333/262; 307/259; 307/262; 307/315
[58] Field of Search .............. 333/17 M, 32, 103, 104, 333/262; 334/15, 55, 56, 47; 331/146, 148, 149, 112; 307/242, 241, 259, 321, 315, 317, 256, 262

[56] References Cited

U.S. PATENT DOCUMENTS

| | | | |
|---|---|---|---|
| 3,146,357 | 8/1964 | Spallone | 307/259 X |
| 3,264,566 | 8/1966 | Kaufman et al. | 325/465 |
| 3,503,014 | 3/1970 | Hall et al. | 307/259 X |
| 3,611,154 | 10/1971 | Kupfer | 325/459 |
| 3,980,957 | 9/1976 | Putzer | 334/15 X |
| 4,186,360 | 1/1980 | Ohashi | 334/55 |
| 4,216,451 | 8/1980 | Nishimura | 334/15 |

Primary Examiner—Paul L. Gensler
Assistant Examiner—Benny Lee
Attorney, Agent, or Firm—Joseph S. Tripoli; George J. Seligsohn

[57] ABSTRACT

A pair of oppositely poled PIN diodes is connected in series across a reactive element. First and second switching circuits responsive to a common control network are serially connected between high and low voltage points. The junction between the switching circuits is connected to the common junction of the PIN diodes. When the first switching circuit is made non-conductive and the second conductive, the PIN diodes are forward biased. When the first switching circuit is made conductive and the second non-conductive, the PIN diodes are reverse biased. In this way the reactive element is switched into and out of a tuned circuit.

11 Claims, 2 Drawing Figures

DIODE SWITCHING SYSTEM FOR A SELECTABLE IMPEDANCE MATCHING NETWORK

The present invention relates generally to a switching system and more particularly to one utilizing diodes for switching an element into and out of a circuit.

In airborne and mobile communications systems where the physical limitations frequently dictate the use of electronically short antenna structures, the need arises for the insertion of a reactive matching network between the antenna and the transmitter (or receiver) to maximize the power transfer to and from the antenna.

The matching network may assume a T or $\pi$ (pi) configuration and element values required for the match must change to effectuate the appropriate match at a particular operating frequency.

The matching process may be performed manually or automatically and the time frame within which it can be accomplished may vary between minutes and seconds, respectively.

With the advent of electronic warfare (EW) systems, matching networks with rapid tuning capabilities (tens of hundreds of microseconds) are required to avoid potential jamming threats to vital communications. One way to meet the speedy tuning requirement is to use semiconductor switches, such as PIN diodes, in place of the conventional electromechanical devices to vary the element values of the antenna matching network.

The use of the PIN diode as a reactive element switch generates the need for appropriate bias circuitry. In the diode "OFF" state, the bias circuit has to provide a reverse dc bias voltage which is equal or greater than the peak RF voltage appearing across the diode. In the "ON" state several hundred milliamperes of forward dc current are required to maintain the RF resistance low. It is often desired to control this switching action through the use of digital logic circuits, for example, in the TTL or CMOS technologies.

In a system embodying the present invention, an element is switched into and out of a circuit by first and second oppositely poled diodes connected in series across the element. A first switch means is connected between a circuit point at a certain voltage level and a junction point between the diodes. A second switch means is connected between the junction point and a point of reference potential. One of the first and second switch means includes a voltage level inversion means. A control means is coupled to the first and second switch means and responds to a first input control voltage level to cause the first switch means to assume a substantially non-conductive state while the second switch means assumes a substantially conductive state. The junction point is then placed at a voltage level near the reference level and each of the diodes is caused to assume the same one of its high and low impedance states. The control means is also responsive to a second input control voltage level to cause the first switch means to assume a substantially conductive state while the second switch means assumes a substantially non-conductive state. This causes the junction point to be placed at a voltage level near the certain voltage level and as a result, each of the diodes is caused to assume the other of its impedance states.

In the drawing:
FIG. 1 is a block diagram of a system which can advantageously use the present invention; and FIG. 2 is a drawing, partially in schematic and partially in block form, illustrating a preferred embodiment of the present invention.

Referring now to FIG. 1, a transmitter (or receiver) 10 is coupled to an antenna 14 via an impedance matching network 12. The system may be, for example, an HF radio communication system operating in the 3-30 MHz band of frequencies. As previously indicated, the impedance matching network 12 can take the form of a $\pi$ or a T-type network comprising reactive elements which can be switched into and out of the network to provide the desired or optimum impedance matching across the HF band between the transmitter 10 and the antenna 14. The antenna 14 is typically a high Q device.

Also shown in FIG. 1 is a control network 16 connected between the transmitter or receiver 10 and the impedance matching network 12. The control network 16 is responsive to the selected operating frequency of the transmitter 10 to cause a change in the impedance matching network 12. For example, in the prior art, the transmitter frequency tuner can be mechanically ganged to the control network 16 to switch an inductor or capacitor into or out of impedance matching network 12. In other prior art arrangements, the control network takes the form of a series of relays which respond to various operating frequency sub-bands to switch the reactive elements of the network 12.

Figure 2:
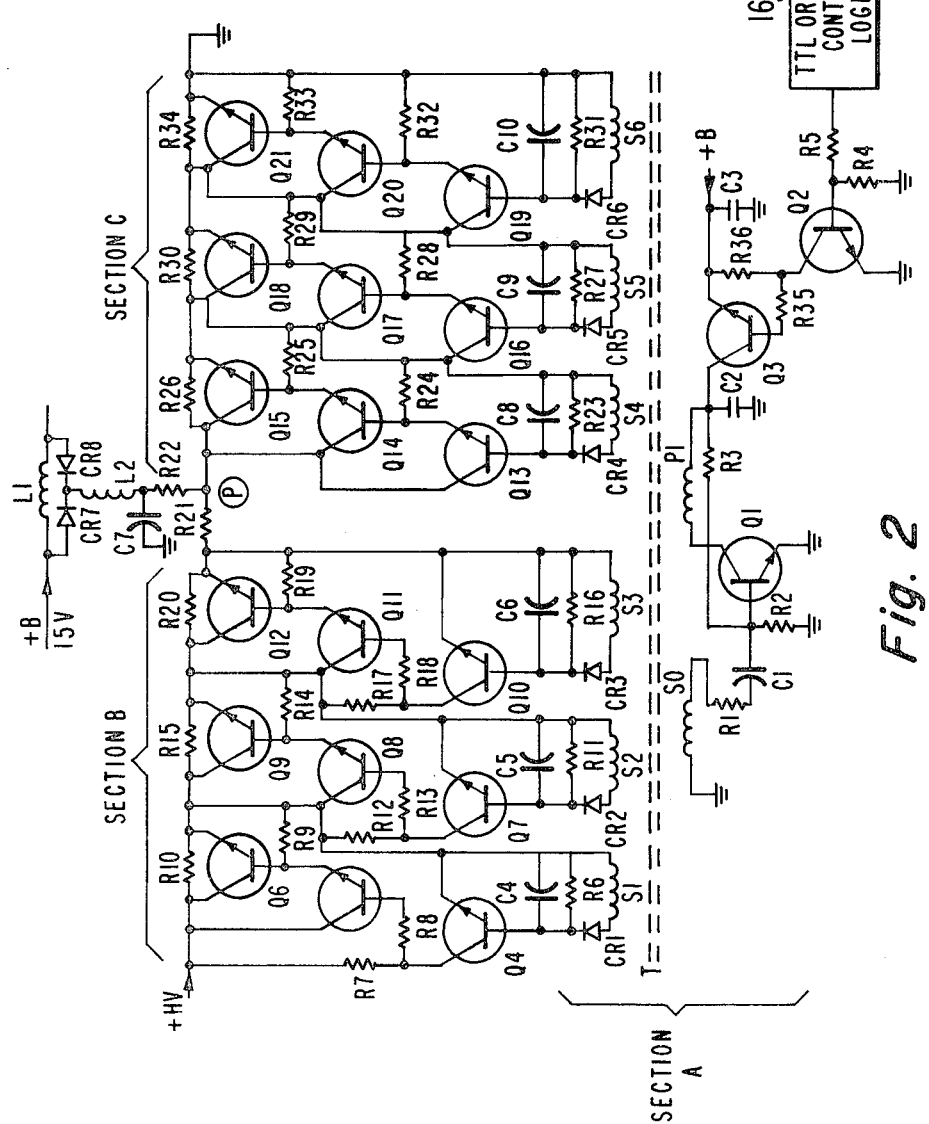

FIG. 2 shows the preferred embodiment of the present invention. The switching system comprises three main sections. Section A is the switch driver section; Section B is the high voltage sourcing section; and Section C is the high current sinking section.

Section A includes a source of input control voltage levels from control logic 16A which is part of the control network 16 shown in FIG. 1. Control logic 16A provides a positive voltage level, representing a logic 1, when it is desired to have a first switching condition and provides a zero or ground potential level, i.e., logic 0, when it is desired to have the other switching condition.

The inductor L1 is a reactive element which forms part of the impedance matching network 12 in FIG. 1 and is the device which is to be switched into and out of that network. Diodes CR7 and CR8 are oppositely poled and connected in series across inductor L1. In the preferred embodiment of the present invention, diodes CR7 and CR8 are PIN diodes.

The switch driver Section A includes the grounded emitter transistor Q2 which has its base electrode connected via resistor R5 to the control logic 16A and has its collector electrode connected via resistor R35 to the base of the common emitter amplifier formed by transistor Q3. The switch driver Section A also includes a blocking oscillator, which consists of transistor Q1, primary winding P1 and secondary winding S0 of transformer T, capacitor C1 and biasing resistors R2 and R3. The transformer T is a multi-filar type transformer and besides the primary and secondary windings P1 and S0, required by the oscillator, the transformer T has an additional number of identical secondary windings S1-S6 corresponding to the number of series connected stages in the switch Sections B and C.

The high voltage sourcing Section B comprises a number of series connected Darlington pairs (three shown in FIG. 2) preceded by corresponding common emitter drivers. The common emitter drivers such as Q4, Q7 and Q10 provide an input to output logic inversion.

The high current sinking Section C comprises a number (three shown) of Darlington triplets, such as Q13, Q14, and Q15 connected in series.

As can be seen in FIG. 2, the high voltage switching Section B is connected between a source of high voltage +HV, on the order of kilovolts, and a circuit junction point P. Switching Section C is connected between junction point P and a point of reference potential, namely ground.

When a logic 1 (positive level) is applied to the base of transistor Q2, transistor Q2 is turned on and this, in turn, causes transistor Q3 to be turned on. The supply voltage plus B volts, is now applied to the oscillator transistor Q1 to start the oscillations. The oscillator output signal now appears at all of the transformer secondaries S1–S6 where it is rectified by the rectifier diodes CR1–CR6. The rectified signal is then filtered by the corresponding capacitors C4–C6 and C8–C10 and the resulting positive voltages are applied to the bases of transistors Q4, Q7, Q10, Q13, Q16, and Q19. The positive input signals at the bases of transistors Q4, Q7 and Q10 drive these transistors into saturation and turn off the corresponding Darlington pairs Q5–Q6, Q8–Q9, and Q11–Q12. This in effect disconnects the high voltage +HV from junction point P. That is, the emitter-collector paths of transistors such as Q6, Q9, and Q12 are substantially non-conductive between the high voltage source and the junction point P except for the leakage through the high impedance path of R10, R15, R20, and R21. At the same time, in switching Section C, the positive input signal at the bases of the transistors Q13, Q16 and Q19 turns on the Darlington triplets comprising transistors Q13–Q14–Q15, Q16–Q17–Q18 and Q19–Q20–Q21. This establishes a low resistance path from point P to ground. The current originating at the +15 volt source flows in the forward direction through both of the PIN diodes CR7 and CR8 and through the RF decoupling choke L2, the current limiting resistor R22 and through the Section C transistor switches to ground. This forward bias current flow can be on the order of 0.5 to 1.0 amperes.

When a logic zero is applied at the base of transistor Q2, transistor Q2 is turned off. This in turn forces transistor Q3 into a non-conductive state and the collector bias for the oscillator transistor Q1 is removed. As a result of this logic zero condition, there is no voltage applied to the bases of the switch input transistors in Sections B and C. With transistors Q13, Q16, and Q19 off, the Darlington triplets of Section C are off, so that there is a relatively high impedance, the series connection of resistors R26, R30, and R34, present between point P and ground. With transistors Q4, Q7, and Q10 turned off, their associated Darlington pairs are turned on and the high voltage +HV now appears at the junction point P and the cathodes of the PIN diodes CR7 and CR8 as a reverse, turn-off bias.

The resistors R10, R15 and R20 in switch Section B and the resistors R26, R30 and R34 in switch Section C which are across the collector to emitter junctions of the corresponding output transistors Q6, Q9, Q12 and Q15, Q18 and Q21 serve the purpose of equalizing the voltages taken up by the individual transistors in the transistor off state.

What is claimed is:

1. A system for switching an element into and out of a circuit, comprising:
    first and second oppositely poled diodes connected in series across said element;
    a first switch means connected between a circuit point at a certain voltage level and a junction point between said diodes;
    a second switch means connected between said junction point and a point of reference potential, one of said first and second switch means including a voltage level inversion means; and
    a control means coupled to said first and second switch means and responsive to a first input control voltage level to cause said first switch means to assume a substantially non-conductive state and said second switch means to assume a substantially conductive state such that said junction point is placed at a voltage level near said reference level and each of said diodes is caused to assume the same one of its high and low impedance states, and said control means being responsive to a second input control voltage level to cause said first switch means to assume a substantially conductive state and said second switch means to assume a substantially non-conductive state such that said junction point is placed at a voltage level near said certain voltage level and each of said diodes is caused to assume the other of its impedance states.

2. The system according to claim 1 wherein said element is a reactive device forming part of a tuned circuit.

3. The system according to claim 2 wherein said first switch means comprises a plurality of Darlington pairs, each pair being driven by an associated voltage level inverting driver stage.

4. The system according to claim 3 wherein said second switch means comprises a plurality of Darlington triplets.

5. The system according to claim 4 wherein said control means comprises:
    an oscillator means responsive to said first input control voltage level for providing oscillations at an oscillator output terminal and responsive to said second input control voltage level for ceasing oscillations at said oscillator output terminal;
    a transformer means having a primary winding connected to said oscillator output terminal and a plurality of secondary windings; and
    a plurality of rectifying circuits, each rectifying circuit being connected to a corresponding one of said plurality of secondary windings and connected in circuit with a respective one of said driver stages and said Darlington triplets.

6. In a system for matching the impedance of an antenna to the impedance presented by a utilization device, said system including an impedance matching network coupling said utilization device to said antenna, said network including a reactive element adapted to be switched in and out of said network, a switching system comprising:
    first and second oppositely poled PIN diodes connected in series across said reactive element;
    a first switch means connected between a circuit point at a certain voltage level and a junction point between said diodes, said first switch means including a voltage level inversion means;
    a second switch means connected between said junction point and a point of reference potential, said certain voltage level having an absolute value much larger than said reference voltage level; and
    a control means coupled to said first and second switch means and responsive to a first input control voltage level to cause said first switch means to assume a substantially non-conductive state and said second switch means to assume a substantially conductive state such that said junction point is placed at a voltage level near said reference level and each of said diodes is caused to assume the same one of its high and low impedance states, and, said control means being responsive to a second input control voltage level to cause said first switch means to assume a substantially conductive state and said second switch means to assume a substantially non-conductive state such that said junction point is placed at a voltage level near said certain voltage level and each of said diodes is caused to assume the other of its impedance states.

7. The system according to claim 6 wherein said reactive element comprises an inductor in said matching network.

8. The system according to claim 7 wherein said first switch means comprises a plurality of Darlington pairs, each pair being driven by an associated voltage level inverting transistor driver stage.

9. The system according to claim 8 wherein said second switch means comprises a plurality of Darlington triplets.

10. The system according to claim 9 wherein said control means comprises:
- a logic circuit for providing said first and second input control voltage levels;
- a blocking oscillator responsive to said first input control voltage level for providing oscillations at an oscillator output terminal and responsive to said second input control voltage level for ceasing oscillations at said oscillator output terminal;
- a transformer having a primary winding connected to said oscillator output terminal and having a plurality of secondary windings; and
- a plurality of rectifying circuits, each rectifying circuit being connected to a corresponding one of said plurality of secondary windings and connected in circuit with a respective one of said transistor driver stages and said Darlington triplets.

11. A circuit for selectively placing a low impedance or a high impedance path across a conductive reactive element, said element forming part of an RF stage responsive to an RF signal, said circuit comprising in combination:
- a pair of oppositely poled PIN diodes connected in series across said reactive element, each diode being capable of assuming a relatively high or relatively low impedance state;
- a terminal, coupled to said reactive element to which a voltage is applied which voltage is of a polarity to forward bias both diodes in their relatively low impedance state when the junction point between the diodes is at a reference potential;
- a series impedance network having one end terminal to which a reverse bias voltage is applied, said reverse bias voltage having an amplitude larger than the peak amplitude level of said RF signal, said series impedance network having an opposite end terminal to which a given reference voltage level is applied, said given reference voltage level having an amplitude substantially smaller than the peak amplitude level of said RF signal, said series impedance network further having a tap terminal, between said one end terminal and said opposite end terminal, connected to said junction point; and
- means responsive to one value of a digital control signal for substantially reducing the impedance of the portion of the series impedance network between the one end terminal and the tap terminal to reverse bias said diodes in their high impedance state, and responsive to a second value of said digital control signal for substantially reducing the impedance of the portion of the series impedance network between the opposite end terminal and the tap terminal to place said junction point at substantially said given reference voltage level to forward bias said diodes.

* * * * *